United States Patent [19]

Kent

[11] 4,352,141

[45] Sep. 28, 1982

[54] TOUCH SWITCH DEVICE

[75] Inventor: Brian Kent, Hemel Hempstead, England

[73] Assignee: Starcote Limited, Hertfordshire, England

[21] Appl. No.: 214,048

[22] Filed: Dec. 8, 1980

[51] Int. Cl.³ ............................................. H01H 36/00
[52] U.S. Cl. .................................. 361/181; 307/116; 328/5
[58] Field of Search ....................... 361/179, 181, 203; 307/116, 592, 597; 340/561, 562, 564; 328/5

[56] References Cited

U.S. PATENT DOCUMENTS

| | | | |
|---|---|---|---|
| 3,111,608 | 11/1963 | Boenning et al. | 361/203 X |
| 4,159,473 | 6/1979 | Senk | 307/116 X |
| 4,287,513 | 9/1981 | Lam et al. | 340/562 |

Primary Examiner—Harry E. Moose, Jr.
Attorney, Agent, or Firm—Kenyon & Kenyon

[57] ABSTRACT

A touch switch device includes a touch plate 3 or other touch member arranged, when touched, to interrupt the passage of an oscillating signal from a DC powered oscillator 31-34 to a charging circuit 36-39, including a capacitative store 38. The charging circuit responds to this interruption to initiate discharge of the charge store, and a control, including an inverter 44 and a flip-flop 46 controls a switch 48 to change from one state to another upon a change of charge state, in this case a recharge, of the charge store. A circuit 51-54 supplies a reset signal to the flip-flop during an initial preset period immediately following the switching on of power to the device, to inhibit this change of state of the switch 48 during such period.

2 Claims, 3 Drawing Figures

TOUCH SWITCH DEVICE

BACKGROUND OF THE INVENTION

This invention relates to a touch switch device, that is to say a switch device which is operable by the action of finger-touching an appropriate touch element, such as a plate, which does not move, the device responding to a charge in electrical characteristics produced by such action or by the close proximity of the human body to the "touch" element.

The invention is particularly, but not exclusively, applicable for automotive, marine or aeronautical use where the available electrical power source can deliver DC power only. Touch switch devices are easy to operate and this factor can be of particular importance in such situations where any reduction in the level of distraction of the operator, who will often be the driver of the vehicle, resulting from the necessity for switch operation is highly desirable. Hitherto, touch switch devices suitable for use in these situations have not been readily available.

SUMMARY OF THE INVENTION

According to the present invention, there is provided a touch switch device comprising a member arranged, when touched or closely approached to interrupt the passage of an oscillating signal to a charging circuit including a capacitative store, said charging circuit being responsive to said interruption to initiate discharge of said charge store, and means responsive to a change in the state of charge of said capacitative charge store to cause a switch to change state, the device being arranged to be powered from a source of direct current and including a circuit responsive to the initial supply of power to the device to cause the said switch to be in a predetermined state for an initial period.

The pulling of the switch in the predetermined state in effect makes the switch unresponsive for the initial period.

DESCRIPTION OF THE DRAWINGS

Two embodiments of the invention will now be described by way of example with reference to the accompanying drawings, in which.

DESCRIPTION OF THE PREFERRED EMBODIMENT

Figure 1:
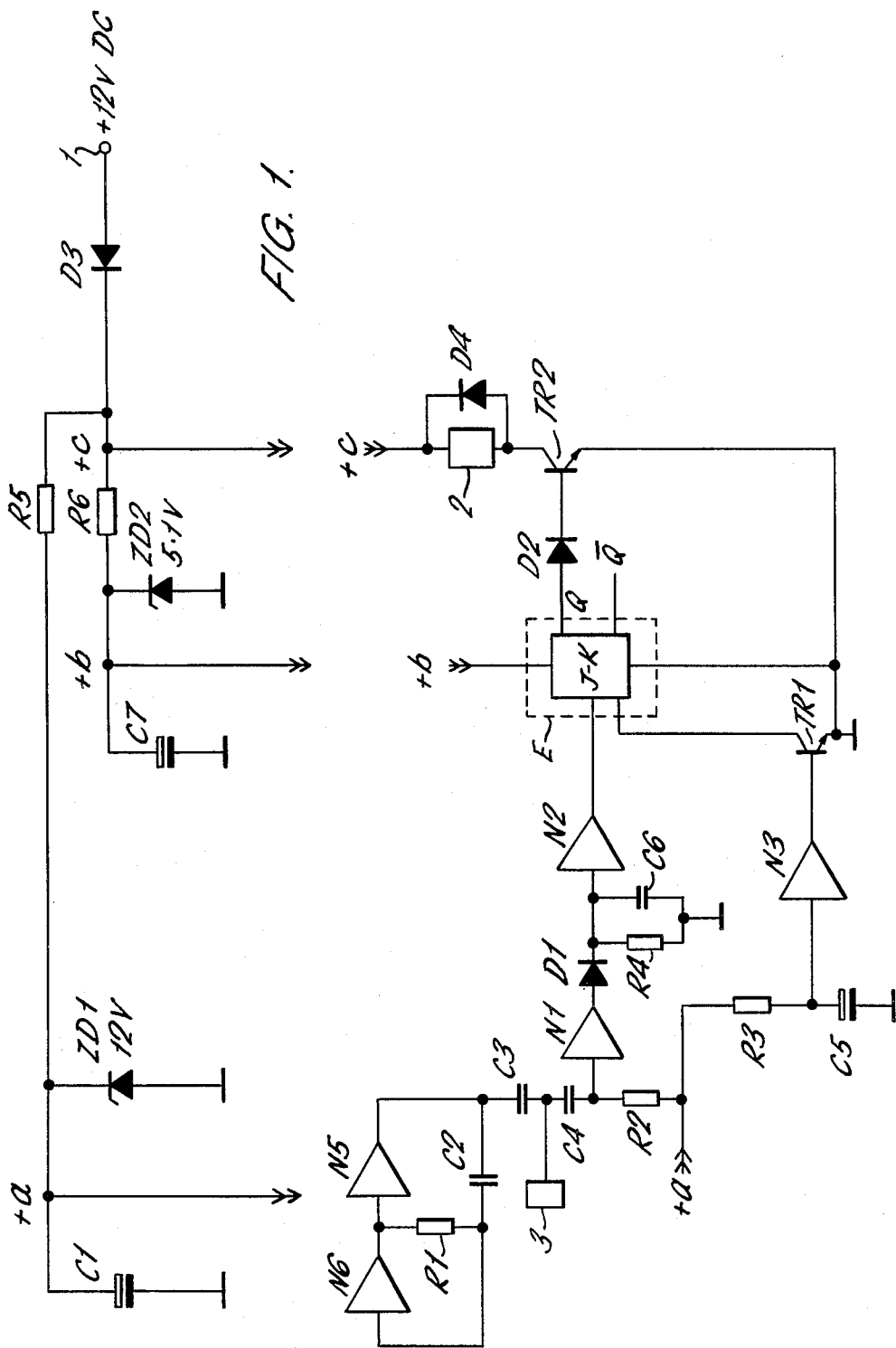
FIG. 1 is a circuit diagram illustrating a touch switch device according to the present invention.
Figure 2:
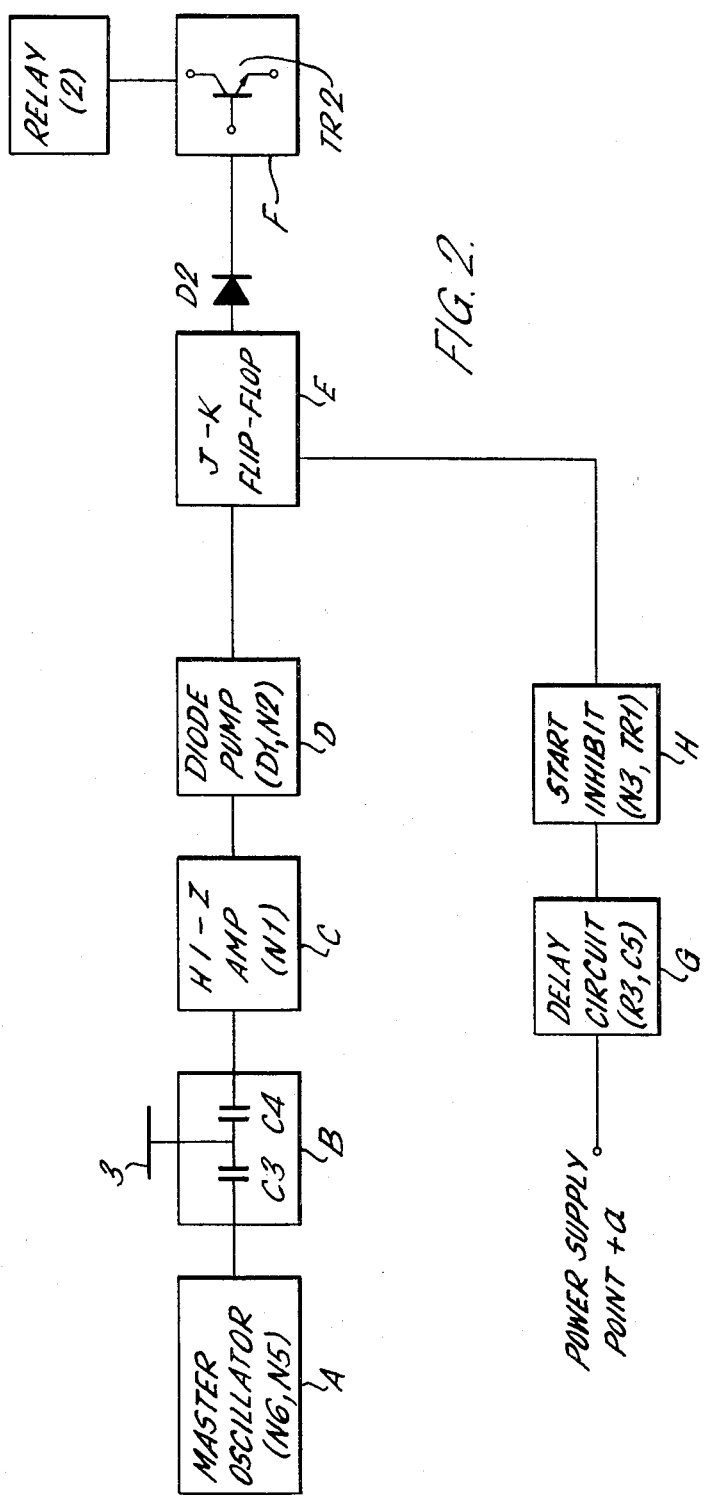
FIG. 2 is a schematic block diagram showing the basic circuit units of the touch switch device of FIG. 1.

The touch switch device of the embodiment shown in FIGS. 1 and 2 is for use with a 12 volt DC battery of which the positive terminal is to be connected to input terminal 1, with the negative terminal connected to the chassis of a vehicle in which the device is located. The battery supplies, through diode D3, 12 volts to a first supply point c; a resistor R5, a 12 volt zener diode ZD1 and a capacitor C1 provide a steady 12 volt potential at a second supply point a, and a resistor R6, a 5.1 volt zener diode ZD2 and a capacitor C7 provide steady 5.1 volts potential at a third supply point b.

A relay coil 2, which is actuable to close a pair of contacts (not shown) for supplying power to a device to be switched and a switching transistor TR2 are connected in series between the first supply point C and chassis. A diode D4 is coupled across the relay coil 2 to avoid undesirable inductive effects when the coil is de-energized.

A master oscillator A comprises two inverters N5,N6 and a C-R network, consisting of resistor R1 and capacitor C2, which determines the frequency of oscillation. In this embodiment a frequency of 1 MHz is used; the oscillator output being a square wave of approximately 12 volt amplitude. The oscillator output is coupled through coupling network B to an amplification stage C consisting of a high impedance amplifier N1, a touch plate 3 being connected to a point in the coupling path through network B. When a finger is placed adjacent the plate 3, body impedance destroys the coupling and the passage of the square wave oscillating signal is interrupted, so that amplifier N1 receives no input signal. When no contact is made with plate 3 and the signal is so coupled, the amplifier N1, which receives a suitable bias voltage via resistor R2, restores the signal to its 12 volt amplitude and feeds a diode pump circuit D. This circuit consists of a diode D1, and a charging circuit comprising a parallel connected capacitor C6 and resistor R4. The diode D1 is connected to prevent capacitor C6 from discharging back through amplifier N1. The diode D1 conducts the positive portions of the square wave to charge, or pump, capacitor C6 so as to maintain the DC voltage level at the junction of diode D1, capacitor C6 and resistor R4 higher than the threshold level of an inverter N2. When this threshold is exceeded the inverter input is effectively at logic 1; for voltage levels below such threshold, the input is effectively at logic 0. Thus, while capacitor C6 is maintained charged, the inverter output, which is coupled to the set input of a flip-flop E is at logic 0. The Q output of flip-flop E is coupled through coupling diode D2 to the base of the relay switch transistor TR2; while it is at logic 0, the transistor TR2 remains non-conductive and the relay coil 1 is maintained de-energized so that the relay contacts are kept open. The flip-flop E is of the type which responds to a negative-going transition at its set input to effect a change of state of the signal at its Q output.

The switch device is activated by briefly touching the touch plate 3; the contact with the plate 3 causes the oscillator's output to be decoupled from the amplifier N1. The diode pump D now receives no signal from amplifier N1 and the capacitor C6 begins to discharge through resistor R4. The voltage at the input of inverter N2 falls below the aforesaid threshold i.e. to logic 0, so that the inverter output rises to logic 1. The set input of flip-flop E accordingly rises to logic 1; in this embodiment the flip-flop does not respond to this transition and its Q output remains in the logic state which it occupied before contact was made with plate 3. However, when the finger is removed from plate 3 the passage of the oscillating signal from oscillator A to amplifier N1 is resumed, and capacitor C6 recharges. When the D.C. voltage level at the input of inverter N2 reaches the threshold, the inverter output falls to logic 1. The flip-flop E responds to this transition to change the logic state at its Q output. This output is coupled through diode D2 to a switching transistor TR2, which, for a change from logic 0 to logic 1 in the Q output, becomes conductive thereby energising relay coil 2 to close the relay contacts. Accordingly, successive switch operations bring about alternate opening and closure of such contacts.

The device also includes a start delay loop comprising a delay circuit G and a start inhibit H. The delay circuit G, comprising series connected resistor R3 and capacitor C5 is coupled to receive the switched supply voltage from point a, and when the power is switched on, to provide 12 volt potential at point a, the voltage at the junction between resistor R3 and capacitor C5 rises with a time constant determined by the values of R3, C5, so as to hold the input to inverter N3 at logic 0 for one second. During this initial one second delay period the output of the inverter N3, which is at logic 1, biases transistor TR1 on. The collector electrode of transistor TR1 is connected to the reset input of the flip-flop E so as to hold the Q output thereof at logic 0 for one second even though, during that time the set input (i.e. the output of inverter N2) may receive a negative going transition following operation of the touch plate. At the end of the one second delay the input to inverter N3 rises to logic 1. The ensuing drop in the inverter output to logic 0 turns off the transistor TR1 to remove the reset signal from the flip-flop, which is thereby enabled to respond to such a transition at its set input to activate the relay coil as described above.

Figure 3:
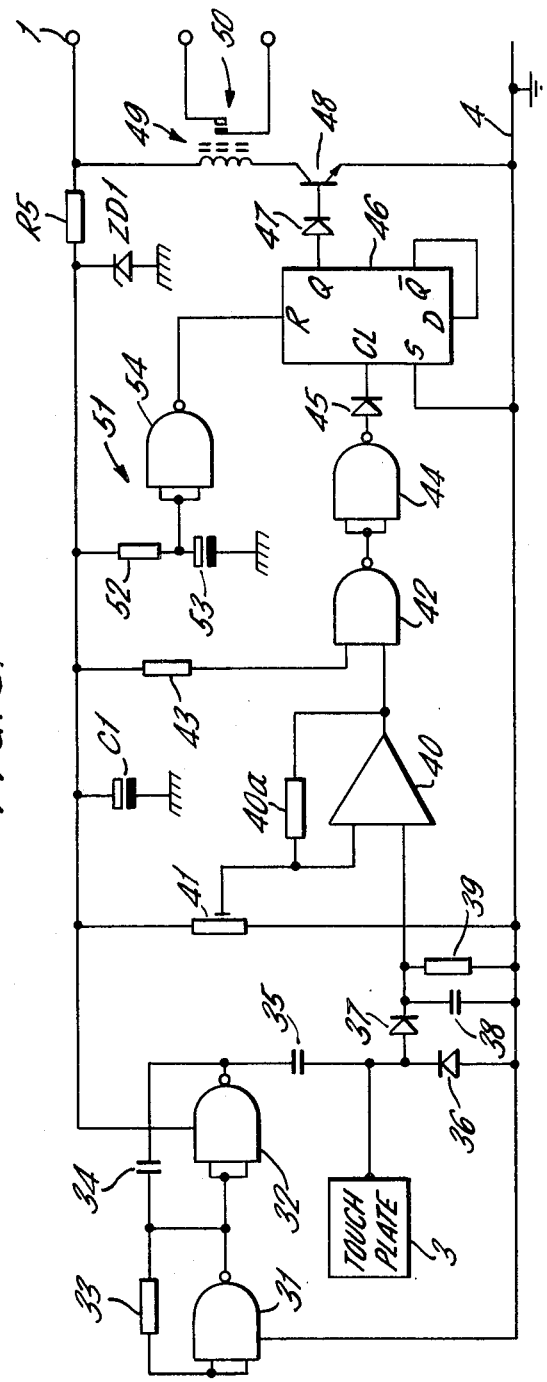
FIG. 3 illustrates another embodiment of the invention.

FIG. 3 illustrates an improved form of the invention. This embodiment includes, as does the first embodiment, a touch plate which is operable by contact or proximity of, for example, a finger to interrupt the path of the oscillatory signal to the capacitative store and, like the first embodiment, includes a circuit which responds to the initial feeding of power to the device to cause the final switch, and a relay driven by it, to assume a predetermined state for an initial period, so that the device is during that initial period unresponsive to a touch of, or close approach to, the touch plate 3.

In the embodiment shown in FIG. 3, the positive power supply terminal 1 is connected, for example by way of an ignition switch, to a source, such as a battery, of direct current. The other line 4 may be constituted by the chassis of the vehicle or some other suitable earth return.

An oscillator is constituted by two NAND gates 31 and 32 coupled as inverters, the input terminals of the inverter 31 being coupled to the output terminal of the inverter 32 by way of a resistor 33 and capacitor 34, of which the junction is connected to the output terminal of inverter 31 and the input terminals of inverter 32. The resistor 33 and capacitor 34 determine the output frequency of the oscillator. This output frequency is at approximately 200 kilohertz.

The oscillator's output is coupled by way of a capacitor 35 to a voltage doubler comprising diodes 36 and 37, capacitor 38 and a resistor 39 in parallel therewith. The voltage doubler includes the capacitative store namely the capacitor 38 and its function is to rectify and smooth the output of the oscillator and store on the capacitor 38 a corresponding direct voltage. Unless the touch plate 3, which is connected between the capacitor 35 and the junction between the diodes 36 and 37, be touched or closely approached, the output of the oscillator has an unimpeded path to the voltage doubler. If the touch plate is touched either directly by a finger or closely approached, by for example a gloved finger, the impedance (which may of the order of 120 kilohms) presented by the touch plate is substantially reduced so that the passage of the oscillator's output to the voltage doubler is interrupted. In consequence, the charge on the capacitor 38 rapidly decays by way of the resistor 39.

An operational amplifier 40 which has, for example, a total stage gain of 100, is provided to sense the voltage provided by the doubler. The output from the operational amplifier is set to logic "zero" by means of a potentiometer 41, connected between the supply lines; the tap of the potentiometer is connected to one input terminal of the operational amplifier. The operational amplifier 40 has the usual feedback resistor 40a.

The output terminal of the operational amplifier 40 is connected to one input terminal of a NAND gate 42 of which the other input terminal is held at a constant logic "one", being connected for this purpose to the terminal 1 by way of a resistor 43. The output from the control gate 42 goes low (to logic "zero" when the touch plate is approached and high (logic "one") when the touch plate is "released".

The output terminal of the control gate 42 is connected by way of an inverter 43 and a diode 45 to the clock input of a D-type bistable 46. In this manner, when the touch plate is "touched" the clock input of the bistable 46 goes high. On the assumption that the Q output from the bistable 46 is low (logic "zero"), then when the touch plate is contacted, a positive pulse at the clock input triggers the bistable and the Q output goes high. This output is connected by way of a diode 47 to the base of a transistor 48, which constitutes a drive for a relay 49 having contacts 50. Thus when the Q output of the bistable 46 goes high, the drive transistor 48 is switched on and, even though the operator's finger may be immediately removed from the touch plate, the Q output remains high and the relay is maintained closed until the touch plate is again operated to cause the bistable 46 to change state. Thereupon the Q output will go low, removing drive to the base of the transistor 48, which will turn off and release the relay 49.

A circuit 51 which will maintain the bistable switch 46, the driver transistor switch 48 and the final relay 49 all in a predetermined state is constituted by a resistor 52 and capacitor 53, connected between the supply terminal and earth, and an inverter 54, of which the input terminals are conjointly connected to the junction between the resistor 52 and the capacitor 53 and of which the output terminal is connected to the reset input terminal of the bistable switch 46. The time constant of the timing circuit constituted by the resistor 52 and 53 is, in this embodiment, about one second. When power is initially fed to the circuit shown in FIG. 3, for example by the closure of an ignition switch connected between the terminal 1 and the battery, the input to the inverter 54 is held "low" until the capacitor 53 is sufficiently charged, the output from the inverter 54 being, at this time, high and ensuring that the Q output of the bistable 46 remains low. During this initial period, irrespective of the state of charge of the capacitor 38 and accordingly irrespective of any operation of the touch plate 3, the driver transistor 48 remains off and the relay contacts 50 stay open. When the capacitor 53 is sufficiently charged, the output of the inverter 54 goes "low" and enables the bistable 46 to respond to changes in level at its clock input, so that after the initial period the relay 49 is opened and closed by successive operations of the touch plate.

I claim:

1. A touch switch device comprising an oscillator; a charging circuit, including a capacitative store, for receiving a signal from said oscillator; means, including a touch plate, responsive to close approach to said plate to interrupt the passage of the signal from said oscillator to said charging circuit, the store being arranged to discharge when the said passage is interrupted; a switch; a bistable circuit controlling the state of the switch; means responsive to a change in the charge state of the store consequent on the said interruption to cause said bistable circuit to change the state of the switch, the switch remaining in the state to which it is changed when the said interruption ceases; means responsive to the supply of electrical power to the device to cause the said bistable circuit to maintain the state of the switch in a predetermined state for an initial period, during which the said switch is maintained unresponsive to interruptions of the said signal; said means responsive to said supply being operative during said initial period to feed a reset signal to said bistable circuit, said bistable circuit being responsive to the reset signal to maintain said switch in said predetermined state; said means responsive to the change in the charge state of the store causing the bistable circuit to control the state of the switch, after the elapse of said initial period, in accord with the changes in the charge state of said capacitative store.

2. A touch switch device according to claim 1 further including a relay coil controlled by said switch.

* * * * *